United States Patent [19]

Davis

[11] 4,017,748
[45] Apr. 12, 1977

[54] MONOLITHIC AC LEVEL DETECTOR

[75] Inventor: Walter Lee Davis, Plantation, Fla.

[73] Assignee: Motorola, Inc., Schaumburg, Ill.

[22] Filed: Dec. 29, 1975

[21] Appl. No.: 644,995

[52] U.S. Cl. .......................... 307/296 R; 307/362; 330/22
[51] Int. Cl.² ...................... H03K 1/12; H03F 3/04
[58] Field of Search .... 307/235 T, 235 W, 235 BC, 307/296, 297; 330/22; 324/4, 5

[56] References Cited

UNITED STATES PATENTS

| | | | |
|---|---|---|---|
| 3,778,640 | 12/1973 | Platt et al. | 307/296 |
| 3,886,466 | 5/1975 | Wheatley, Jr. | 330/22 |
| 3,903,479 | 9/1975 | Limberg | 330/22 |
| 3,906,386 | 9/1975 | Honqu et al. | 330/22 |

Primary Examiner—Stanley D. Miller, Jr.
Assistant Examiner—B. P. Davis
Attorney, Agent, or Firm—Margaret Marsh Parker; James W. Gillman

[57] ABSTRACT

Matched semiconductor junctions on a single integrated circuit chip are connected in a current mirror arrangement to provide a low power AC level detector arrangement using only one resistor. Two transistors are identical except for junction area and each is in series with a constant current source. Since all other physical characteristics are identical, when identical voltages are applied, the junction currents are related by the ratio of their areas. By fabricating the area of the second emitter-base junction to be less than the area of the first, a portion of the current from the second current source is diverted therefrom to the base of a third transistor, forcing the latter into saturation. Accordingly, when an AC input signal of at least threshold level is coupled to the base of the second transistor, the current in the second transistor is driven to the level of its source. The current formerly diverted to the third transistor now drops to zero and the voltage across the third transistor rises immediately to its supply voltage. The input threshold level required to shut off the third transistor can be varied by different chip design parameters or by modifying a current source with an external digital control.

8 Claims, 4 Drawing Figures

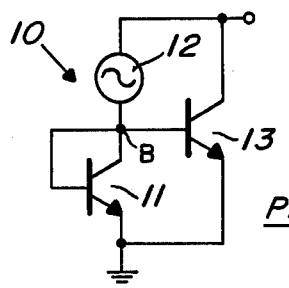
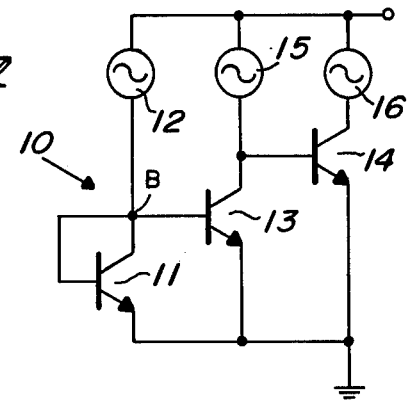
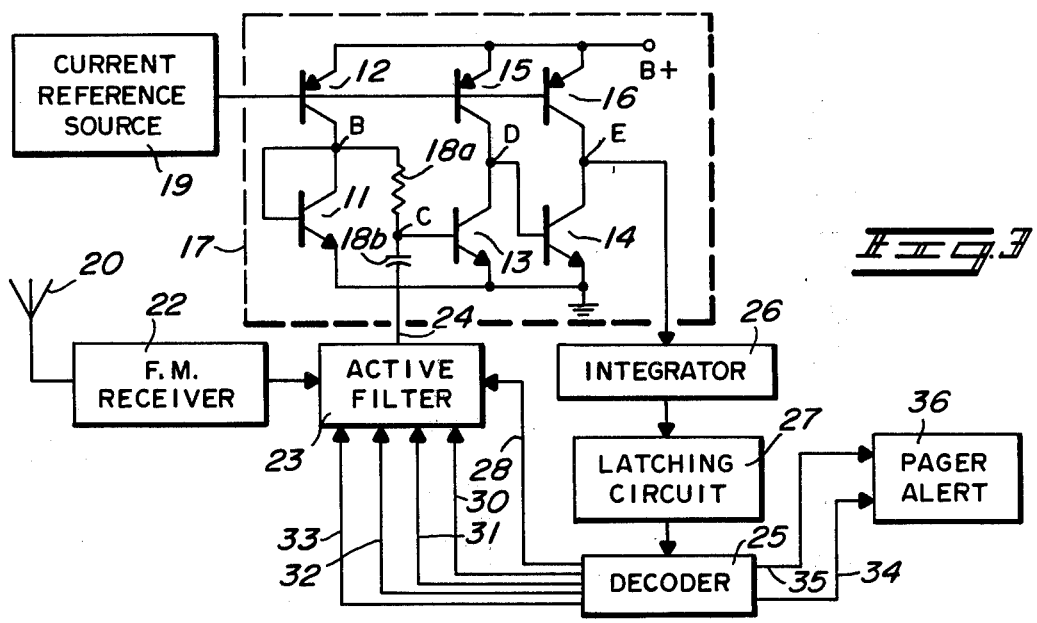
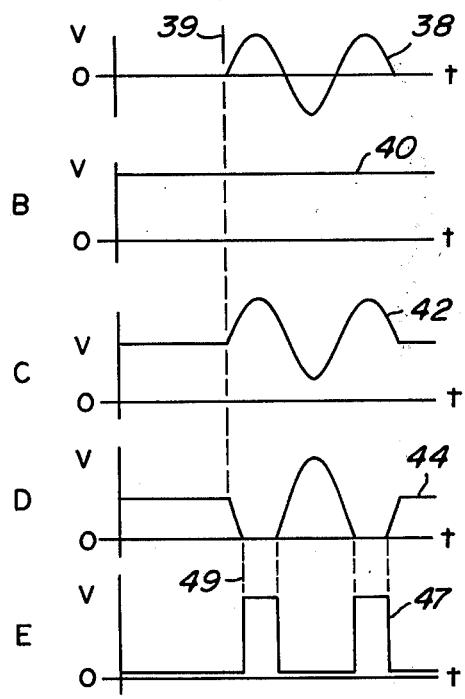
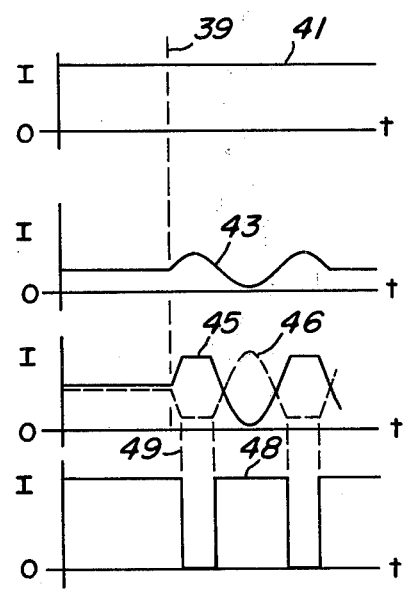

MONOLITHIC AC LEVEL DETECTOR

BACKGROUND OF THE INVENTION

This invention relates to detector arrangements generally and more particularly to an improved AC level detector especially suited for adaptation in integrated circuit chip form.

AC level detectors form a part of many kinds of electronic circuits and have always posed a problem due to the conflicting demands of high accuracy and economy of parts. With the advent of monolithic circuit design, the use of resistors in circuits has become undesirable due to the chip area required for them and the power lost in them. For low voltage battery powered devices, such as pocket pagers, these considerations become even more important. Previous designs for AC level detectors have required a number of resistors in an attempt to reduce sensitivity to supply voltage variation, which resulted in added inaccuracies due to resistor tolerances.

SUMMARY OF THE INVENTION

It is the object of the present invention to provide an improved AC level detector adapted for implementation in integrated circuit chip form.

It is a more particular object to provide an improved detector of the foregoing type which is characterized by a high degree of accuracy but which requires a minimum of power and a minimum of chip area.

The above objectives are achieved in an intergrated circuit chip in accordance with the present invention by the use of current source biasing the current mirrors to eliminate dependance on resistor-determined bias levels. The core of the level detector is comprised of three transistors, each having a separate current source. Being on a single chip, all have identical physical characteristics with the exception of junction area. The first transistor is diode connected and the voltage reference level which is established across it is coupled to the emitter-base junction of the second transistor. The second transistor thus tracks the voltage of the first transistor exactly but since it has either a much smaller junction area or a larger current source the second transistor cannot support the available current and the excess current from the second source is diverted to the base of the third transistor for controlling its conductivity. The current in the second transistor thus provides a current reference level. Under normal no-signal conditions, the third transistor is in saturation and the output voltage across the third transistor is essentially zero. When an AC signal is added to the voltage reference level on the base of the second transistor it causes the current in the latter to vary around the current reference level. When the current in the second transistor reaches a predetermined level, the third transistor is driven to cut off and the supply voltage appears across the output.

The threshold level of the input voltage, which also determines the length of the output pulses, can be varied by the manufacturing design parameters of the chip, or can be varied by adjusting the current sources with digital control inputs.

BRIEF DESCRIPTION OF THE DRAWING

FIG. 1 is a circuit diagram of a conventional current mirror.

FIG. 2 is a circuit diagram of the basic elements of a level detector according to the present invention.

FIG. 3 is a block diagram of a typical application including the level detector circuit.

FIG. 4 is a chart of waveforms at strategic points in the circuit of FIG. 2.

DESCRIPTION OF A PREFERRED EMBODIMENT

Referring now more particularly to the drawing, wherein like parts have like numerals throughout, FIG. 1 shows a conventional current mirror 10 as known in the art. The term "mirror" is used to signify that the current in one portion of the circuit faithfully tracks the current in another portion. A diode-connected transistor 11 ("diode" hereinafter) is connected in series with a constant current source 12. The diode voltage at point B is applied to the base of transistor 13. If the current in the diode 11 is I, the current in the transistor 13 will be NI where N is the ratio of the junction area of the transistor 13 to the junction are of the diode 11.

FIG. 2 shows an arrangement constructed in accordance with the present invention wherein a current mirror such as shown at 10 may be connected to control another transistor such as at 14, each diode and transistor having its own current source, indicated generally at 12, 15 and 16, respectively. As in the circuit of FIG. 1, the voltage reference of the diode 11 is applied to the transistor 13. In the preferred embodiment, current sources 12 and 15 are identical and the junction area of transistor 13 is less than the juction area of transistor diode 11. Thus, the transistor 13 will not support the full current of its source 15. It is to be understood as also within the scope of the invention to have the two referenced junction areas identical, but have the current source 15 capable of supplying more current than the source 12. In either case, the excess current from the source 15 will be diverted to the base of transistor 14 which may thereby be driven into saturation.

FIG. 3 includes the circuit arrangement of FIG. 2, now designated as reference numeral 17 with a typical environment as shown in block diagram form. As indicated, input circuit 18 has been added to the circuit of FIG. 2 and consists of an isolating resistor 18a and capacitor 18b. A current reference source 19 is coupled to the current sources 12, 15, 16. The sensitivity of the level detector can be controlled by electronically or manually switching an additional current source into or out of the collector circuit of either transistor 11 or transistor 13.

In this exemplary application, a signal received by an antenna 20 of an electrical device, such as for example, a pocket pager, is demodulated in an FM receiver portion 22. The resulting audio signal, which might consist of a sequence of five or six audio frequency tones is connected to an active filter 23. Since the pager is looking for one specific sequence of tones, the filter will initially be looking for the first tone of that sequence. If the tone is present in the filter output 24 with sufficient amplitude, the AC level detector 17 according to the present invention will provide output to the decoder 25 through an integrating network 26 and a latching circuit 27. The purpose of the integrating network 26 is to prevent one strong noise pulse from activating the decoder. The latching circuit 27, once activated by a desired tone, provides a sustained output in case the received signal is lost too soon to activate the decoder 25. A first decoder output 28 is coupled to reset the active filter 23 and a second decoder output 30 will instruct the active filter to look for the second tone of the desired sequence. This procedure may be reiterated, if necessary, for second, third and fourth tone-initiated signals, utilizing decoderfilter connections 31, 32 and 33. Each consecutive tone must be received within a predetermined time interval for proper circuit activation. The fifth and sixth tone-initiated signals are coupled by means of connections 34 and 35 to a pager alert 36 which notifies the user that his personal code has been received. Typically, the function of a toneonly pager as here referenced is to alert the user that a message is awaiting him at a predetermined telephone address.

In FIG. 4, the waveforms for voltage and current at various critical points in circuit 17 are shown in relation to a signal input voltage 38 being applied to the input terminal 24. A time line 39 indicates the beginning of an AC input. A voltage waveform 40 represents the voltage reference level at point B and remains essentially constant, as does a current waveform 41, isolated from the input signal 38 by the resistor 18a. The waveform 41 represents the current in the diode 11. A voltage 42 at point C is essentially the sum of waveforms 38 and 40 and appears on the base of the transistor 13. A current 43 is the baseemitter current of transistor 13. A voltage 44, point D, appears on the collector of transistor 13 and the base of transistor 14.

A current waveform 45, shown as a solid line, is the collector current of the transistor 13, and dotted current waveform 46 is the base-emitter current of the transistor 14. A voltage waveform 47 is the output voltage at the point E. A current waveform 48 is the collector current of the transistor 14.

Operationally, when there is no input signal applied to the terminal 24, all other voltages shown remain unchanging at the respective predetermined levels as indicated by the first portion of each waveform, to the left of the time line 39. When the AC input signal 38 is applied to the level detector circuit via the terminal 24, the signal is superimposed on the reference voltage 40 as shown in the second portion of 42 and the current 43 through the base-emitter of transistor 13 is controlled accordingly. As this current rises, the voltage 44 begins to fall and when it reaches zero or essentially zero, as at time 49, transistor 13 reaches saturation as shown by its collector current 45. Transistor 14 is cut off and the voltage 47 across the transistor 14, and thus on the output terminal 21, jumps to a value approximating the supply voltage. The pulses of waveforms 47 are coupled to the integrator circuit 26 as described hereinbefore and, if of proper amplitude and duration, activates the decoder 25 and the decoding procedure continues.

The theory of operation can best be understood by consideration of the current-voltage characteristics of a semiconductor junction. In the conduction region, the current flowing through the junction is related to the voltage across it by the diode equation:

$$I = J_s A e^{\frac{qV}{kT}} \quad (1)$$

Where:

$$J_s = \frac{qD_p P_n}{L_p} \quad (2)$$

and is a function of several physical parameters related to the structure of the junction. On a single IC chip, these parameters are the same for all devices of the same type. Thus, $J_s$ is a constant for devices with the same geometry: $A$ is the area of the semiconductor junction, $V$ is the voltage across the junction, $q$ is the electronic charge, $k$ is Boltzmann's constant and $T$ is the temperature is absolute degrees.

Now, from equation (1), it follows that if the two matched devices have different junction areas, the currents through the two devices are given by:

$$I_1 = J_s A_1 e^{\frac{qV_1}{kT}} \text{ and } I_2 = J_s A_2 e^{\frac{qV_2}{kT}} \quad (3)$$

where $I_1$, $I_2$, $V_1$, $V_2$ are the junction currents and voltages. Further, if these two devices are connected together so that they have the same junction voltage, we have:

$$\frac{I_1}{A_1} = J_s e^{\frac{qV}{kT}} = \frac{I_2}{A_2}$$

Thus, the currents through the junctions ae directly related to the junction areas. This relationship between current and area is the basis of the current mirror frequently used in bipolar integrated circuits and shown in FIG. 1. In this circuit, in which the emitter base junctions of transistors 11 and 13 are connected in parallel and where transistors 13 has N times the emitter-base junction area of transistor 11, the current I that is forced through the diode-connected transistor 11 is "mirrored" as a current flow NI in 13. That is, 13 could support a collector current of NI if it were available. Since the area-current relationship (4) is valid for any value of N, it is also valid for N = ½. In this case transistor 11 has twice the area of transistor 13. For N = ½, the transistor 13 in the current mirror shown in FIG. 1 can support or "sink" a current of ½I. If a current source of greater than ½I were connected to the collector of transistor 13, the transistor would not be able to sink the current in excess of ½I. Thus, as in FIG. 2 where current sources 12 and 15 (each = I) are connected to both transistors 11 and 13, transistor 13 can only sink ½I and the remainder of current from current source 15 flows into the base of transistor 14 and forces it to be saturated, i.e., the collector of transistor 14 is forced to be near ground.

Now, if an AC signal is capacitively coupled to the base of the transistor 13 as shown in FIG. 3, the current in the transistor 13 will vary directly with the input signal level. If the peak current in the transistor 13 reaches I, then the transistor 14 will have no base current and its output will be off. The input signal required to cause the transistor 14 to switch off is determined by the circuit parameters and the integrated circuit geometries. From equations 3, the incremental voltage required to increase the current in the transistor 13 by a factor of M is:

$$M = \frac{1}{N} = \frac{I \text{ peak}}{Idc} = e^{\frac{q\Delta V}{kT}}$$

or:

$$\Delta V = V \text{ peak} = kT/q \ln(1/N) = 0.026 \ln(1/N) \text{ volts at } 25°\text{C}$$

for:

$$N = \frac{1}{2},\ V \text{ peak} = 0.026 (0.693) = 18\text{mV at } 25°\text{C}$$

Thus, whenever the AC input signal exceeds 0.026 ln (1/N) volts, the output of the detector circuit changes state, and this output signal can be processed by additional circuitry to implement a tone detector, etc.

Thus there is provided, according to the invention herein disclosed, an adjustable and highly accurate AC level detector in integrated circuit form. The accuracy is, in large parts, due to the matched characteristics of transistors formed on one integrated circuit chip. By the use of transistors instead of resistors on the chip as current sources, not only is the accuracy of the detector improved, but the chip area required is greatly reduced along with the power losses in the current sources.

Although the invention has been shown in a specific embodiment for purposes of illustration, no limitation is to be inferred therefrom. It is intended to include all variations and modifications falling within the spirit and scope of the invention.

What is claimed is:

1. An improved AC level detector arrangement in integrated circuit form comprising in combination;

first transistor means connected as a diode and having a first semiconductor junction area to establish a first current reference level;

additional transistor means forming first amplifier means and coupled to said transistor diode, said additional transistor means having a second semiconductor junction area, smaller than said first semiconductor junction area, to establish a second current reference level related to said first current reference level by the ratio of the respective junction area thereof;

second amplifier means coupled to the first amplifier means and having its conductivity controlled by a portion of said second reference current; and means coupled to the first amplifier means for applying an input signal to vary the current of said first amplifier means around the second reference level, whereby a predetermined level of input signal will effect cutoff of said second amplifier means and produce a voltage output pulse from said second amplifier means.

2. An improved AC level detector arrangement in integrated circuit form comprising in combination:

first, second and third transistors, each coupled to a respective current source, said first transistor being connected as a diode and having a first semiconductor junction area to establish a given current reference level, said second transistor being connected as an amplifier cand coupled to said first transistor diode and having a second semiconductor junction area for supporting a current related to the current reference level by the ratio of the respective junction areas, said third transistor being connected as an amplifier and coupled to said second transistor for receiving current from the second current source; and an AC input means coupled to the second transistor for varying the current in the second transistor and varying inversely the current in the third transistor, whereby an AC input signal having a predetermined value will render the third transistor non-conductive.

3. An AC level detector arrangement according to claim 2 wherein the current sources comprise transistors.

4. An AC level detector arrangement according to claim 2 wherein the first and second current sources are substantially equal and wherein the junction area of the second transistor is less than the junction area of the first transistor.

5. An AC level detector arrangement according to claim 2 wherein the junction area of the first transistor is substantially equal to the junction area of the second transistor, and the second current source supplies more current than the first current source.

6. An AC level detector arrangement according to claim 2 and further including control means coupled to at least one of said first and second current sources for providing external control of said predetermined value of current reference level.

7. An AC level detector arrangement according to claim 2 wherein the AC input means includes a filter and the output voltage is responsive to the voltage level of the filter output.

8. An AC level detector arrangement comprising:

a voltage supply;

a first current source;

a diode-connected transistor means coupled to the first current source for providing a first current reference level and having a first junction area;

a first transistor amplifier means having a second junction area smaller than the junction area of the diode-connected transistor means and coupled to the latter for producing in the first amplifier means a second current reference level related to the first current reference level by the ratio of the respective junction areas;

a second current source coupled to the first amplifier means and capable of supplying more current than the second current reference level;

a third current source;

a second transistor amplifier means coupled to the third current source and coupled to receive the excess current from the second current source for controlling the conductivity of the second amplifier means;

output terminals connected across the second amplifier means;

an AC signal input means coupled to the first amplifier means for varying the current in the latter around the second current reference level; and whereby a predetermined input signal level renders the second amplifier means non-conductive, providing a voltage across the output terminals substantially equal to the supply voltage.

* * * * *